US009217929B2

(12) United States Patent
Egbe et al.

(10) Patent No.: US 9,217,929 B2
(45) Date of Patent: *Dec. 22, 2015

(54) COMPOSITION FOR REMOVING PHOTORESIST AND/OR ETCHING RESIDUE FROM A SUBSTRATE AND USE THEREOF

(75) Inventors: Matthew I. Egbe, West Norriton, PA (US); Denise Geitz, Bethlehem, PA (US)

(73) Assignee: AIR PRODUCTS AND CHEMICALS, INC., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/896,589

(22) Filed: Jul. 22, 2004

(65) Prior Publication Data

US 2006/0016785 A1  Jan. 26, 2006

(51) Int. Cl.
*B44C 1/22*  (2006.01)
*C09K 3/00*  (2006.01)
*G03F 7/42*  (2006.01)
*H01L 21/02*  (2006.01)

(52) U.S. Cl.
CPC .......... *G03F 7/425* (2013.01); *H01L 21/02063* (2013.01); *H01L 21/02071* (2013.01)

(58) Field of Classification Search
CPC .............. G03F 7/425; H01L 21/02071; H01L 21/02063
USPC .................... 252/79.1, 79.2, 79.3, 79.4, 79.5; 134/1.3, 2, 36, 42; 216/57, 87, 90, 83
See application file for complete search history.

(56) References Cited

U.S. PATENT DOCUMENTS

| | | | | |
|---|---|---|---|---|
| 4,744,834 A * | 5/1988 | Haq | ............................ | 510/176 |
| 5,185,235 A * | 2/1993 | Sato et al. | ...................... | 430/331 |
| 5,444,023 A | 8/1995 | Homma | | |
| 5,529,887 A * | 6/1996 | Horn et al. | .................... | 430/331 |
| 5,563,119 A | 10/1996 | Ward | | |
| 5,567,574 A * | 10/1996 | Hasemi et al. | ................ | 430/331 |
| 5,792,274 A | 8/1998 | Tanabe et al. | | |
| 5,849,467 A * | 12/1998 | Sato et al. | ..................... | 430/327 |
| 6,033,993 A * | 3/2000 | Love et al. | .................... | 438/745 |
| 6,117,364 A | 9/2000 | Vorderbruggen et al. | | |
| 6,372,410 B1 * | 4/2002 | Ikemoto et al. | .............. | 430/318 |
| 6,417,112 B1 | 7/2002 | Peyne et al. | | |
| 6,440,326 B1 | 8/2002 | Maruyama et al. | | |
| 6,472,357 B2 | 10/2002 | Takashima | | |
| 6,531,436 B1 * | 3/2003 | Sahbari et al. | ................ | 510/176 |
| 6,554,912 B2 | 4/2003 | Sahbari | | |
| 6,677,286 B1 | 1/2004 | Rovito et al. | | |
| 6,869,921 B2 | 3/2005 | Koito et al. | | |
| 2002/0108678 A1 * | 8/2002 | Montano et al. | ............. | 148/276 |
| 2002/0128164 A1 | 9/2002 | Hara et al. | | |
| 2003/0114014 A1 * | 6/2003 | Yokoi et al. | .................... | 438/745 |
| 2003/0130147 A1 | 7/2003 | Koito et al. | | |
| 2003/0138737 A1 | 7/2003 | Wakiya et al. | | |
| 2003/0148910 A1 | 8/2003 | Peters et al. | | |
| 2003/0181342 A1 | 9/2003 | Seijo et al. | | |
| 2004/0009883 A1 | 1/2004 | Ikemoto et al. | | |
| 2004/0038154 A1 | 2/2004 | Muramatsu et al. | | |
| 2004/0063042 A1 * | 4/2004 | Egbe | ............................ | 430/329 |
| 2004/0106531 A1 | 6/2004 | Kanno et al. | | |
| 2004/0106532 A1 | 6/2004 | Yokoi et al. | | |
| 2004/0180300 A1 * | 9/2004 | Minsek et al. | ................ | 430/329 |
| 2004/0220066 A1 * | 11/2004 | Rutter | ........................... | 510/175 |
| 2004/0266637 A1 | 12/2004 | Rovito et al. | | |
| 2005/0014667 A1 * | 1/2005 | Aoyama et al. | ............... | 510/175 |
| 2005/0019688 A1 | 1/2005 | Wakiya et al. | | |
| 2005/0084792 A1 | 4/2005 | Yokoi et al. | | |
| 2005/0106492 A1 | 5/2005 | Yokoi et al. | | |
| 2005/0119143 A1 | 6/2005 | Egbe et al. | | |
| 2006/0003910 A1 * | 1/2006 | Hsu et al. | ...................... | 510/176 |
| 2006/0014656 A1 * | 1/2006 | Egbe et al. | .................... | 510/175 |

FOREIGN PATENT DOCUMENTS

| | | | | |
|---|---|---|---|---|
| EP | 0 723 205 | A1 | 7/1996 | |
| EP | 1091254 | | 4/2001 | |
| EP | 1 128 222 | A2 | 8/2001 | |
| EP | 1138726 | * | 10/2001 | |
| EP | 1619557 | A1 | 1/2006 | |
| JP | 07-271057 | * | 10/1995 | |
| JP | 10-289891 | A | 10/1998 | |
| JP | 11-084687 | * | 3/1999 | |
| JP | 2000-087089 | * | 3/2000 | |
| JP | 2000-089481 | A | 3/2000 | |
| JP | 200368699 | A | 3/2003 | |
| JP | 2003-122028 | * | 4/2003 | |
| JP | 3406055 | | 5/2003 | |
| JP | 2003-228179 | A | 8/2003 | |
| JP | 2003228179 | * | 8/2003 | ................ G03F 7/42 |
| JP | 2004-133153 | A | 4/2004 | |
| WO | WO-2004/009730 | A1 | 1/2004 | |

(Continued)

OTHER PUBLICATIONS

English Machine Translation of JP2003228179 (6 pages).*
Akihiro et al. (Generation Mechanism of Photoresist Residue after Ashing, J. Electrochem. Soc., vol. 141, No. 9, Sep. 1994, pp. 2487-2493) Used Only As Evidence.*
Polewska et al., "In Situ STM Study of Cu(111) Surface Structure and Corrosion in Pure and Benzotiazole-Containing Sulfuric Acid Solution", J. Phys. Chem. B 1999, 103, 10440-10451.
Szocs, et al. "Electrochemical behaviour of an inhibitor film formed on copper surface", Corrosion Science, 47 (2005) 893-908.
Feng, et al., "Corrosion Protection of Copper by a Self Assembled Monolayer of Alkanethiol", J. Electrochem. Soc., vol. 1447, No. 1, Jan. 1997, 55-64.
Laibinis, et al., "Self-Assembled Monolayers of n~Alkanethiolates on Copper are Barrier Films that Protect the Metal against Oxidation by Air", J. Am Chem. Soc. 1992, 114, 9022-9028.

(Continued)

*Primary Examiner* — Duy Deo
*Assistant Examiner* — Mahmoud Dahimene
(74) *Attorney, Agent, or Firm* — Rosaleen P. Morris-Oskanian; Anne B. Kiernan

(57) ABSTRACT

Compositions containing certain organic solvents comprising at least 50% by weight of a glycol ether and a quaternary ammonium compound are capable of removing residues such as photoresist and/or etching residue from an article.

19 Claims, No Drawings

(56) References Cited

FOREIGN PATENT DOCUMENTS

| WO | WO-2004/019134 A1 | 3/2004 |
| WO | 2004/030038 A2 | 4/2004 |
| WO | WO-2004/094581 A1 | 11/2004 |
| WO | WO-2006/093770 A1 | 9/2006 |

OTHER PUBLICATIONS

Huang, et al., "Dissolution of copper thin films in hydroxylamine-based solutions", Int. J. Miner. Process., 72 (2003) 365-372.

Carter, Melvin Keith, Radical Formation in Hydroxylamine-Copper Chemical Mechanical Planarization Processes, Journal of The Electrochemical Society, 150 (2), 2003, pp. G107-G111.

* cited by examiner

COMPOSITION FOR REMOVING PHOTORESIST AND/OR ETCHING RESIDUE FROM A SUBSTRATE AND USE THEREOF

BACKGROUND OF THE INVENTION

Numerous steps are involved in the fabrication of microelectronic structures. Within the manufacturing scheme of fabricating integrated circuits selective etching of different surfaces of the semiconductor is sometimes required. Historically, a number of vastly different types of etching processes, to selectively remove material, have been successfully utilized to varying degrees. Moreover, the selective etching of different layers, within the microelectronic structure, is considered a critical and crucial step in the integrated circuit fabrication process.

Increasingly, reactive ion etching (RIE), is the process of choice for pattern transfer during via, metal line and trench formation. For instance, complex semi-conductor devices such as advanced DRAMS and microprocessors, which require multiple layers of back end of line interconnect wiring, utilize RIE to produce vias, metal lines and trench structures. Vias are used, through the interlayer dielectric, to provide contact between one level of silicon, silicide or metal wiring and the next level of wiring. Metal lines are conductive structures used as device interconnects. Trench structures are used in the formation of metal line structures. Vias, metal lines and trench structures typically expose metals and alloys such as Al, Al and Cu alloys, Cu, Ti, TiN, Ta, TaN, W, TiW, silicon or a silicide such as a silicide of tungsten, titanium or cobalt. The RIE process typically leaves a residue (of a complex mixture) that may include re-sputtered oxide material as well as possibly organic materials from photoresist and anti-reflective coating materials used to lithographically define the vias, metal lines and or trench structures.

It would therefore be desirable to provide a selective cleaning composition and process capable of removing residues such as, for example, remaining photoresist and/or processing residues, such as for example, residues resulting from selective etching using plasmas and/or RIE. Moreover, it would be desirable to provide a selective cleaning composition and process, capable of removing residues such as photoresist and etching residue, that exhibits high selectivity for the residue as compared to metals, high k dielectric materials, silicon, silicide and/or interlevel dielectric materials including low k dielectric materials such as deposited oxides that might also be exposed to the cleaning composition. It would be desirable to provide a composition that is compatible with and can be used with such sensitive low-k films as HSQ, MSQ, FOx, black diamond and TEOS (tetraethylsilicate).

SUMMARY OF THE INVENTION

The composition disclosed herein is capable of selectively removing residue such as photoresist and processing residue from a substrate without attacking to any undesired extent metal, low k, and/or high k dielectric materials that might also be exposed to the composition. In addition, the composition disclosed herein may exhibit minimal etch rates of certain dielectric materials such as silicon oxide.

In one aspect, there is provided a composition for removing residues comprising at least about 50% by weight of an organic solvent; wherein at least about 50% of the organic solvent contained therein is a glycol ether; and at least about 0.5% by weight of a quaternary ammonium compound.

In another aspect, the composition may further include an auxiliary organic solvent that includes at least one of a dihydric alcohol and/or a polyhydric alcohol. In still a further aspect, the composition may comprise water and optionally a corrosion inhibitor.

Also disclosed herein is a method for removing residues including photoresist and/or etching residue from a substrate that comprises contacting the substrate with the above-disclosed composition.

BEST AND VARIOUS MODES FOR CARRYING OUT INVENTION

A composition and process comprising same for selectively removing residues such as, for example, photoresist and/or processing residues such as the residues generated by etching particularly reactive ion etching. In a cleaning process involving articles such as substrates useful for microelectronic devices, typical contaminants to be removed may include, for example, organic compounds such as exposed photoresist material, photoresist residue, UV- or X-ray-hardened photoresist, C—F-containing polymers, low and high molecular weight polymers, and other organic etch residues; inorganic compounds such as metal oxides, ceramic particles from CMP slurries and other inorganic etch residues; metal containing compounds such as organometallic residues and metal organic compounds; ionic and neutral, light and heavy inorganic (metal) species, moisture, and insoluble materials, including particles generated by processing such as planarization and etching processes. In one particular embodiment, residues removed are processing residues such as those created by reactive ion etching.

Moreover, the photoresist and/or processing residues are typically present in an article that also includes metal, silicon, silicate and/or interlevel dielectric material such as deposited silicon oxides and derivitized silicon oxides such as HSQ, MSQ, FOX, TEOS and Spin-On Glass, and/or high-k materials such as hafnium silicate, hafnium oxide, barium strontium titanium (BST), $Ta_2O_5$, and $TiO_2$, wherein both the photoresist and/or residues and the metal, silicon, silicide, interlevel dielectric materials and/or high-k materials will come in contact with the cleaning composition. The composition and method disclosed herein provides for selectively removing residues without significantly attacking the metal, silicon, silicon dioxide, interlevel dielectric materials, and/or high-k materials. In one embodiment, the composition discloured herein may be suitable for structures containing sensitive low k-films. In certain embodiments, the substrate may contain a metal, such as, but not limited to, copper, copper alloy, titanium, titanium nitride, tantalum, tantalum nitride, tungsten, titanium/tungsten, aluminum and/or aluminum alloys. The compositions disclosed herein may comprise at least about 50% by weight of an organic solvent wherein at least about 50% of the organic solvent contained therein is a glycol ether and at least about 0.5% by weight of a quaternary ammonium compound. In certain embodiments, the composition may contain from about 50 to about 70% of the glycol ether, or from about 50 to about 60% of the glycol ether.

The glycol ethers are typically water miscible and may include glycol mono($C_1$-$C_6$)alkyl ethers and glycol di($C_1$-$C_6$) alkyl ethers, such as but not limited to, ($C_1$-$C_{20}$)alkane diols, ($C_1$-$C_6$)alkyl ethers, and ($C_1$-$C_{20}$)alkane diol di($C_1$-$C_6$)alkyl ethers.

Examples of glycol ethers are ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl ether, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, ethylene glycol monomethyl ether acetate, ethylene glycol monoethyl ether acetate, propylene glycol monomethyl ether, propylene glycol dimethyl ether, propylene glycol monobutyl ether, propylene glycol monopropyl ether, dipropylene glycol monomethyl ether, dipropylene glycol monopropyl ether, dipropylene glycol monoisopropyl ether, dipropylene monobutyl ether, dipropylene glycol diisopropyl ether, tripropylene glycol monomethyl ether, 1-methoxy-2-butanol, 2-methoxy-1-butanol, 2-methoxy-2-methylbutanol, 1,1-dimethoxyethane and 2-(2-butoxyethoxy) ethanol.

More typical examples of glycol ethers are propylene glycol monomethyl ether, propylene glycol monopropyl ether, tri(propylene glycol) monomethyl ether and 2-(2-butoxyethoxy) ethanol.

As mentioned previously, the composition further includes one or more quaternary ammonium compound. Examples of quaternary ammonium compounds include lower-alkyl (e.g. ($C_1$-$C_4$) quaternary ammonium compounds and include tetramethylammounium hydroxide (TMAH), tetraethylammounium hydroxide, tetrabutylammonium hydroxide, tetrapropylammounium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, and (1-hydroxypropyl) trimethylammonium hydroxide. In certain embodiments, the quaternary ammonium compounds are added to the compositions in the free base or hydroxide form. The quaternary ammonium compounds are present in an amount ranging from about 0.5% to 15%. In certain embodiments, the compositions may contain from about 0.5% to about 5% or from about 1% to about 5%.

In certain embodiments, the composition may contain one or more auxiliary organic solvent. In these embodiments, the organic solvent may be water miscible and includes dihydric and polyhydric alcohols such as diols and polyols such as ($C_2$-$C_{20}$) alkane diols and (C3-$C_{20}$) alkane triols, cyclic alcohols and substituted alcohols.

Particular examples of these auxiliary organic solvents are propylene glycol, tetrahydrofurfuryl alcohol, diacetone alcohol and 1,4-cyclohexanedimethanol. In these embodiments, the auxiliary organic cosolvent is present in amounts ranging from 0.1 to about 40% or from 0.1 to 20% by weight.

The composition may optionally contain up to about 40% by weight of water, or up to about 35% by weight of water or up to about 10% by weight of water. In embodiments wherein water is added to the composition, the water is deionized water.

The compositions of the present disclosure can also optionally contain up to about 20% by weight, or about 0.2 to about 19% by weight of a corrosion inhibitor. Examples of corrosion inhibitors include, but are not limited to, organic acids, organic acid salts, catechol, gallic acid, benzotriazole (BZT), resorcinol, other phenols, acids or triazoles, and more typically hydroxylamines or acid salts thereof. Preferred hydroxylamines are diethylhydroxylamine and the lactic acid and citric acid salts thereof. Ordinarily, hydroxylamines are not considered as being compatible with copper because of their ability to etch. However, in the composition of the present disclosure they surprisingly inhibit copper corrosion.

In certain embodiments, the composition may include a fluoride containing compound. Fluoride containing compounds may include those of the general formula $R_1R_2R_3R_4NF$ where $R_1$, $R_2$, $R_3$, and $R_4$ are each independently hydrogen, an alcohol group, an alkoxy group, an alkyl group and mixtures thereof. Examples of such compositions are ammonium fluoride, tetramethyl ammonium fluoride and tetraethyl ammonium fluoride. Still further examples of fluoride-containing compounds include fluoroboric acid, hydrofluoric acid, and choline fluoride. In these embodiments, the fluoride containing compound or mixture thereof is present in amounts of from 0.1% by weight to 20% or from 0.1 to 10% by weight based on the total weight of the composition. In certain embodiments, the fluoride compound is added to the compositions in the form of a fluoride salt.

The composition may also include one or more of the following additives: surfactants, chelating agents, chemical modifiers, dyes, biocides, and other additives. Some examples of representative include acetylenic alcohols and derivatives thereof, acetylenic diols (non-ionic alkoxylated and/or self-emulsifiable acetylenic diol surfactants) and derivatives thereof, alcohols, quaternary amines and di-amines, amides (including aprotic solvents such as dimethyl formamide and dimethyl acetamide), alkyl alkanolamines (such as diethanolethylamine), and chelating agents such as beta-diketones, beta-ketoimines, carboxylic acids, mallic acid and tartaric acid based esters and diesters and derivatives thereof, and tertiary amines, diamines and tri-amines.

Compositions disclosed herein are compatible with low-k films such as HSQ (FOx), MSQ, SiLK, etc. including those containing a fluoride. The formulations are also effective in stripping photoresists including positive and negative photoresists and plasma etch residues such as organic residues, organometallic residues, inorganic residues, metallic oxides, or photoresist complexes at low temperatures with very low corrosion of aluminum, copper, titanium containing substrates. Moreover, the compositions are compatible with a variety of high dielectric constant materials.

During the manufacturing process, a photoresist layer is coated on the substrate. Using photolithographic process, a pattern is defined on the photoresist layer. The patterned photoresist layer is thus subjected to plasma etch by which the pattern is transferred to the substrate. Etch residues are generated in the etch stage. Some of the substrates used in this invention are ashed while some are not ashed. When the substrates are ashed the main residues to be cleaned are etchant residues. If the substrates are not ashed, then the main residues to be cleaned or stripped are both etch residues and photoresists.

The composition disclosed herein are used to remove post etch and ash, organic and inorganic residues as well as polymeric residues from semiconductor substrates at low temperatures with low corrosion. In general, the stripping and cleaning processes using the composition disclosed herein are carried out by immersing a substrate in the stripper/cleaner composition at one or more temperatures ranging from 25° C. to 85° C. for a period of time ranging from 3 minutes to 1 hour. However, the composition can be used in any method known in the art that utilizes a cleaning fluid for the removal of photoresist, ash or etch residues and/or residues.

The following non-limiting examples are presented to further illustrate the present disclosure.

The photoresists in the following examples undergo one of the processes as discussed below.

A positive photoresist is a spin-coated on to a substrate. The positive photoresist comprises diazonaphthoquinone and novolak resin. The photoresist after being coated is baked at about 90° C. for about 90 seconds. A pattern is defined on the photoresist by exposure, through a patterned mask, to i-line (365 nm) rays followed by development. The pattern is then transferred via plasma etch to the substrate.

A negative photoresist is spin-coated on to a substrate. The photoresist after being coated is baked at about 90° C. for about 90 seconds. A pattern is defined on the photoresist by exposure, through a patterned mask, to i-line (365 nm) rays followed by development. The pattern is then transferred via plasma etch to the substrate.

A positive photoresist is spin-coated on to a substrate. The photoresist coated is baked at 90° C. for 90 seconds. A pattern is defined on the photoresist by exposure, through a patterned mask, to deep ultra-violet (248 nm) rays followed by development. The pattern is then transferred via plasma etch to the substrate.

The stripper and cleaner compositions of the present invention are typically prepared by mixing the components together in a vessel at room temperature until all solids have dissolved. Examples of the aqueous stripper and cleaner compositions are set forth in Table I. The summary of etch rate data and cleaning data are provided in Tables II and III, respectively.

During the manufacturing process, a photoresist layer is coated on the substrate. Using photolithographic process, a pattern is defined on to the photoresist layer. The patterned photoresist layer is thus subjected to plasma etch by which the pattern is transferred to the substrate. Etch residues are generated in the etch stage. Some of the substrates used in this disclosure are ashed while some are not ashed. When the substrates are ashed the main residues to be cleaned are etch residues. If the substrates are not ashed, then the main residues to be cleaned or stripped are both etch residues and photoresists.

All of the examples from the Table I were very effective in stripping and cleaning photoresists, etch and ashed residues. The process temperature is typically 40° C. or less and each of the examples can be used in batch cleaning process, spray tools and single wafer tools.

For the following tables, all amounts are given in weight percent and add up to 100 weight percent unless otherwise noted. Metal etch rates were determined using a CDE Res-Map 273 Four Point Probe (E-M-DGLAB-0007). 500 mls of test solution was placed in a 600 ml beaker with stirring and heated, if required to the specified temperature. If the metal to be tested was titanium, an initial dip in phosphoric acid was required. The initial thickness of a wafer was determined using the CDE ResMap 273 Four Point Probe. After determining the initial thickness, test wafers were immersed in the test solution. If only one test wafer was being examined, a dummy wafer was added to the solution. After five minutes the test wafers were removed from the test solution, rinsed for three minutes with deionized water and completely dried under nitrogen. If a negative stripper solution was used, an intermediate rinse of the test wafer in a solvent such as DMAC or IPA (isopropyl alcohol) was performed for three minutes prior to the water wash. The thickness of each wafer was measured and if necessary the procedure was repeated on the test wafer.

Oxide etch rates were determined using a Nanospec AFT 181 (E-M-DGLAB-0009). 200 mls of a test solution was placed in a 250 ml beaker with stirring and heated, if required, to the specified temperature. Three circles were scribed on each of the wafers to be tested. The marked areas on each wafer were the areas in which measurements would be taken. Initial measurements of each wafer were taken. After the initial measurements the wafers were immersed in the test solution for five minutes. If only one wafer was placed in a beaker containing solution a dummy wafer was placed in the beaker. After five minutes each test wafer was washed with deionized water for three minutes and dried under nitrogen. If a negative stripper solution was used DMAC, IPA or another suitable solvent was used to rinse the test wafers for three minutes prior to the water rinse. Measurements of the scribed areas on each wafer were taken and if necessary the procedure was repeated.

TABLE I

Sample Formulations

| Example A | | Example B | | Example C | | Example A1 | |
|---|---|---|---|---|---|---|---|
| BEE | 92 | BEE | 89 | THEA | 48 | PGME | 57.6 |
| TBAH | 0.6 | TBAH | 0.6 | TMAH | 5 | Water | 20.9 |
| p-TSA | 2.8 | p-TSA | 2.8 | p-TSA | 2.8 | TBAH | 1.1 |
| MEA | 1 | MEA | 1 | MEA | 1 | TEA/p- | 2.4 |
| Water | 3.6 | Water | 3.6 | Water | 13.2 | TSA | |
| | | | | PGME | 30 | DEHA | 5 |
| | | | | | | Resorcinol | 3 |

| Example D | | Example E | | Example F | | Example A2 | |
|---|---|---|---|---|---|---|---|
| PGME | 92 | PGME | 75 | PGME | 76 | PGME | 62.7 |
| TBAH | 0.6 | TMAH | 5.5 | TMAH | 5.5 | DI Water | 25 |
| p-TSA | 2.8 | p-TSA | 2.8 | p-TSA | 4 | TMAF | 1 |
| MEA | 1 | MEA | 1 | MEA | 1.4 | lactic acid | 3 |
| Water | 3.6 | water | 15.7 | Water | 10.1 | TEAH | 8.3 |
| | | | | Citric acid | 3 | | |

| Example G | | Example H | | Example I | | Example A3 | |
|---|---|---|---|---|---|---|---|
| PGME | 55 | PGME | 69 | PGME | 80 | PGPE | 36 |
| TBAH | 5.5 | TBAH | 5.5 | TMAH | 5.5 | PGME | 31 |
| p-TSA | 4 | p-TSA | 4 | water | 5.5 | water | 21.3 |
| MEA | 1.4 | MEA | 1.4 | citric acid | 2 | TBAH | 1.7 |
| water | 14.1 | water | 10.1 | DEHA | 7 | MEA/p-TSA | 2 |
| PGPE | 20 | DEHA | 10 | | | DEHA | 5 |
| | | | | | | Resorcinol | 3 |

| Example J | | Example K | | Example L | | Example A4 | |
|---|---|---|---|---|---|---|---|
| PGPE | 66 | PGPE | 56 | PGPE | 56 | PGME | 54.7 |
| PG | 10 | t- | | t-PGME | 35.5 | DI Water | 29 |
| TMAH | 5.5 | PGME | 39 | water | 0 | TMAF | 1 |
| DEHA | 7 | water | 0.4 | TBAH | 0.5 | TES-tos | 4 |
| p-TSA | 3 | TBAH | 0.6 | p-TSA | 6 | lacic acid | 3 |
| lactic acid | 2 | p-TSA | 3 | MEA | 2 | TEAH | 8.3 |
| MEA | 1 | MEA | 1 | | | | |
| Water | 5.5 | | | | | | |

| Example M | | Example N | | Example O | | Example A5 | |
|---|---|---|---|---|---|---|---|
| t-PGME | 91.5 | PGPE | 66 | PGPE | 66 | PGME | 57 |
| water | 0.2 | PG | 10 | PG | 13 | TMAH | 6 |
| TBAH | 0.3 | TMAH | 5.5 | TMAH | 5.5 | DEHA | 4 |
| p-TSA | 6 | DEHA | 8 | DEHA | 8 | water | 31 |
| MEA | 2 | p-TSA | 3 | Water | 5.5 | lactic acid | 2 |
| | | lactic acid | 2 | lactic acid | 2 | | |
| | | Water | 5.5 | | | | |

| Example P | | Example Q | | Example R | | Example S | |
|---|---|---|---|---|---|---|---|
| t-PGME | 66 | Water | 0.9 | t-PGME | 43 | PGPE | 58 |
| PG | 13 | t-PGME | 80 | DI | 32.2 | PG | 23 |
| TMAH | 5.5 | t-BA | 10 | Water | 0.8 | TMAH | 2.5 |
| DEHA | 8 | TBAH | 1.1 | Amm. | 15 | DEHA | 8 |
| water | 5.5 | p-TSA | 6 | Fluoride | 8 | TMAF | 0.8 |
| lactic acid | 2 | MEA | 2 | PG | 1 | lactic acid | 2 |
| | | | | DEHA | | DI water | 5.7 |
| | | | | TMAH | | | |

The following are the acronyms used in Table I:

| | |
|---|---|
| PGME | Propylene glycol methyl ether |
| PG | Propylene glycol |
| PGPE | Propylene glycol methyl ether |
| t-BA | tributyl amine |
| TMAH | tetramethylammonium hydroxide |
| p-TSA | p-toluenesulfonic acid |
| TMAF | tetramethylammonium fluoride |
| TEA/p-TSA | triethanolammonium p-tosylate |
| MEA/p-TSA | ethanolammonium p-tosylate |
| THFA | Tetrahydrofurfuryl alcohol |
| BEE | 2-(2-Butoxy)ethanol |
| DEHA | Dihydroxyamine |
| t-PGME | Tri(propylene glycol) methyl ether |
| TBAH | tetrabutylammonium hydroxide |
| MEA | ethanolamine |
| TEAH | tetraethylammonium Hydroxide |

EXAMPLE A

As Table I illustrates, the composition of example A consists of 92 weight % of BEE, 0.6 weight % of TBAH, 3.6 weight % of deionized water, 2.8 weight % of p-TSA and 1 weight % of MEA. Example A is a cleaning and stripping composition for removing etch residues and photoresists from metal lines as well as vias.

EXAMPLE C

The composition of example C consists of 48 weight % of THFA, 5 weight % of TMAH, 30 weight % of PGME, 2.8 weight % of p-TSA, 1 weight % of MEA and 13.2 weight % of deionized water. Example C is a cleaning and stripping composition for removing etch residue and photoresists from transition metal substrates as well as high-k materials.

EXAMPLE E

The composition of example E consists of 75 weight % of PGME, 5.5 weight % of TBAH, 2.8 weight % of p-TSA, 1 weight % of MEA and 13.2 weight % of deionized water. Example E is a cleaning and stripping composition for removing etch residue and photoresists from transition metal substrates as well as high-k materials.

EXAMPLE H

The composition of example H consists of 69 weight % of PGME, 5.5 weight % of TBAH, 10 weight % of DEHA, 4 weight % of p- TSA, 1.4 weight % of MEA and 10.1 weight % of deionized water. Example H is a cleaning and stripping composition for removing etch residue and photoresists from transition metal substrates as well as high-k materials.

EXAMPLE K

The composition of example K consists of 56 weight % of PGPE, 0.6 weight % of TBAH, 39 weight % of t-PGME, 3 weight % of p-TSA, 1 weight % of MEA and 0.4 weight % of deionized water. Example K is a cleaning and stripping composition for removing etch residue and photoresists from transition metal substrates as well a high-k materials.

EXAMPLE N

The composition of example N consists of 66 weight % of PGPE, 5.5 weight % of TMAH, 10 weight % of PG, 3 weight % of p-TSA, 8 weight % of DEHA, 2 weight % of lactic acid and 5.5 weight % of deionized water. Example N is a cleaning and stripping composition for removing etch residue and photoresists from transition metal substrates as well as high-k materials.

EXAMPLE O

The composition of example O consists of 66 weight % of PGPE, 5.5 weight % of TMAH, 13 weight % of PG, 8 weight % of DEHA, 2 weight % of lactic acid and 5.5 weight % of deionized water. Example O is a cleaning and stripping composition for removing etch residue and photoresists from transition metal substrates as well as a high-k materials.

EXAMPLE P

The composition of example P consists of 66 weight % of PGPE, 5.5 weight % of TMAH, 13 weight % of PG, 8 weight % of DEHA, 2 weight % of lactic acid and 5.5 weight % of deionized water. Example P is a cleaning and stripping composition for removing etch residue and photoresists from transition metal substrates as well as a high-k materials.

EXAMPLE Q

The composition of example Q consists of 80 weight % of t-PGME, 1.1 weight 30% of TBAH, 10 weight % of t-BA, 6 weight % of p-TSA, 2 weight % of MEA and 0.9 weight % of deionized water. Example Q is a cleaning and stripping composition for removing etch residue and photoresists metal lines as well as a vias.

EXAMPLE A1

The composition of example A1 consists of 57.6 weight % of PGME, 1.1 weight % of TBAH, 2.4 weight % of triethanolammonium p-tosylate, 5 weight % of DEHA, 3 weight % of resorcinol and 20.9 weight % of deionized water. Example A1 is a cleaning and stripping composition for removing etch residue and photoresists metal substrates, low-k materials as well as a high-k materials.

EXAMPLE A2

The composition of example A2 consists of 62.7 weight % of PGME, 1.6 weight % of TEAH, 1 weight % of tetramethylammonium fluoride, 3 weight % of lactic acid and 31.7 weight % of deionized water. Example A2 is a cleaning and stripping composition for removing etch residue and photoresists metal substrates, low-k materials as well as a high-k materials.

EXAMPLE A5

The composition of example A5 consists of 57 weight % of PGME, 6 weight % of TMAH, 4 weight % of DEHA, 2 weight % of lactic acid and 31 weight % of deionized water. Example A5 is a cleaning and stripping composition for removing etch residue and photoresists metal substrates, low-k materials as well as a high-k materials.

TABLE II

Summary of etch rate data

| Examples | Temperature (°C.) | Al (Å/minute) | Cu (Å/minute) | Ti (Å/minute) | W (Å/minute) |
|---|---|---|---|---|---|
| A | 65 | <1 | Nt | ~1 | Nt |
| B | 65 | <1 | Nt | ~1 | Nt |
| C | 65 | >500 | nt | Nt | Nt |
| D | 65 | ~1 | ~8 | Nt | Nt |
| E | 65 | >500 | ~5 | Nt | Nt |
| F | 65 | >500 | Nt | Nt | Nt |
| G | 65 | >500 | Nt | Nt | Nt |
| H | 65 | >500 | ~5 | Nt | Nt |
| I | 65 | >500 | ~5 | Nt | Nt |
| J | 65 | ~20 | ~2 | Nt | Nt |
| K | 65 | ~10 | ~7 | Nt | Nt |
| L | 65 | ~1 | ~5 | Nt | Nt |
| M | 65 | ~3 | ~7 | Nt | Nt |
| N | 65 | >500 | ~2 | Nt | Nt |
| O | 65 | >500 | ~1 | Nt | Nt |
| P | 65 | >500 | ~2 | Nt | Nt |
| Q | 65 | ~3 | ~9 | Nt | Nt |
| R | 25 | >500 | ~7 | Nt | Nt |
| S | 40 | >500 | ~3 | Nt | Nt |
| A1 | 65 | ~1 | ~2 | <1 | ~2 |
| A2 | 25 | >500 | ~2 | ~1 | <1 |
| A2 | 50 | >1000 | ~6 | >100 | ~7 |
| A3 | 65 | Nt | ~4 | Nt | Nt |
| A4 | 25 | >500 | Nt | Nt | Nt |
| A5 | 65 | >500 | ~5 | Nt | Nt |

TABLE III

Summary of cleaning data

| Examples | Substrate A Temp (°C.) | Substrate A Lines | Substrate A Vias | Substrate A Comments | Substrate B Temp (°C.) | Substrate B Ashed | Substrate B Unashed | Substrate B comments |
|---|---|---|---|---|---|---|---|---|
| A | 50 | √ | X | Part. Corr. | | Nt | nt | |
| B | | Nt | Nt | | 60 | ✓ | X | |
| C | 50 | ✓ | X | | | Nt | Nt | |
| D | 55 | ✓ | X | | | Nt | Nt | |
| E | | Nt | Nt | | 60 | ✓ | ✓ | |
| F | | Nt | Nt | | 60 | ✓ | X | |
| G | | Nt | Nt | | 60 | ✓ | X | |
| H | | Nt | Nt | | 60 | ✓ | X | |
| K | 50 | ✓ | ✓ | Corr. | 65 | X | X | |
| N | | Nt | Nt | | 65 | √ | ✓ | |
| | | Nt | Nt | | 75 | √ | ✓ | |
| O | | nt | nt | | 65 | √ | ✓ | |
| | | Nt | Nt | | 75 | √ | √ | |
| | | Nt | Nt | | 85 | √ | √ | |
| P | | Nt | Nt | | 65 | √ | X | |
| Q | 55 | X | X | | | Nt | Nt | |
| A1 | 55 | √ | □ | | | Nt | Nt | |
| A1 | 65 | √ | ✓ | | | Nt | Nt | |
| A2 | | Nt | Nt | | 40 | √ | X | |
| A5 | | Nt | Nt | | 65 | √ | √ | Corr. |

Nt = not tested; Part. Corr. = partial metal corrosion; Corr. = metal corrosion; ✓ = partially cleaned; √ = completely cleaned; X = not cleaned.

The invention claimed is:

1. A method for removing photoresist or etching residue or both from the substrate wherein said method comprises contacting a substrate with a composition consisting essentially of:
   a) at least about 50% by weight of organic solvent consisting essentially of glycol ether and at least one of $C_2$-$C_{20}$ alkane diols or $C_3$-$C_{20}$ alkane triols, wherein at least about 50% of the organic solvent is said glycol ether, and wherein said glycol ether is selected from polyethylene glycol monomethyl ether, propylene glycol monopropyl ether, dipropylene glycol monomethyl ether, tripropylene glycol monomethyl ether, ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl ether, diethylene glycol monobenzyl ether, diethylene glycol dimethyl ether, diethylene glycol diethyl ether, triethylene glycol monomethyl ether, triethylene glycol dimethyl ether, diethylene glycol methyl ethyl ether, ethylene glycol monomethyl ether acetate, ethylene glycol monoethyl ether acetate, propylene glycol monomethyl ether, propylene glycol dimethyl ether, propylene glycol monobutyl ether, dipropylene glycol monopropyl ether, dipropylene glycol monoisopropyl ether, dipropylene monobutyl ether, dipropylene glycol diisopropyl ether, 1-methoxy-2-butanol, 2-methoxy-1-butanol, 2-methoxy-2-methylbutanol, 1,1-dimethoxyethane, and 2-(2-butoxyethoxy) ethanol;
   b) at least about 0.5% by weight of one or more quaternary ammonium hydroxides wherein said one or more quaternary ammonium hydroxides is selected from tetramethylammonium hydroxide, tetraethylammonium hydroxide, tetrapropylammonium hydroxide, tetrabutylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, and (1-hydroxypropyl)trimethylammonium hydroxide;
   c) 0.2 to 19% by weight of corrosion inhibitor selected from the group consisting of gallic acid, lactic acid, and citric acid and salts thereof, catechol, benzotriazole (BZT), resorcinol, phenols, triazoles, hydroxylamines or acid salts thereof, or mixtures thereof; and
   d) optionally water.

2. The method of claim 1 wherein the glycol ether is selected from the group consisting of propylene glycol monomethyl ether, propylene glycol monopropyl ether, and tri (propylene glycol) monomethyl ether.

3. The method of claim 1 wherein the one or more quaternary ammonium hydroxides is tetramethyl ammonium hydroxide.

4. The method of claim 1 wherein the amount of the glycol ether is about 50% to about 70% by weight of the composition.

5. The method of claim 1 wherein the amount of the glycol ether is about 50% to about 60% by weight of the composition.

6. The method of claim 1 wherein the amount of the one or more quaternary ammonium hydroxides is about 0.5% to about 15% by weight of the composition.

7. The method of claim 1 wherein the amount of the one or more quaternary ammonium hydroxides is about 0.5% to about 5% by weight of the composition.

8. The method of claim 1 wherein said corrosion inhibitor is hydroxylamines or acid salts thereof or mixtures thereof.

9. The method of claim 1 wherein said corrosion inhibitor is diethyl hydroxylamine or acid salt thereof or mixtures thereof.

10. The method of claim 1 wherein said corrosion inhibitor consists essentially of diethyl hydroxylamine or acid salt thereof.

11. The method of claim 1 wherein said $C_2$-$C_{20}$ alkane diol or a $C_3$-$C_{20}$ alkane triol consists essentially of propylene glycol.

12. The method of claim 11 wherein the amount of the propylene glycol is about 0.1 to about 40% by weight of the composition.

13. The method of claim 1 wherein water is present.

14. The method of claim 1 wherein the amount of said at least one of $C_2$-$C_{20}$ alkane diol or $C_3$-$C_{20}$ alkane triol is about 0.1 to about 20% by weight.

15. The method of claim 1 wherein the corrosion inhibitor is lactic acid, citric acid or salts thereof.

16. The method of claim 2 wherein the amount of the glycol ether is about 50% to about 70% by weight of the composition, and the amount of the one or more quaternary ammonium hydroxides is about 0.5% to about 15% by weight of the composition.

17. The method of claim 10 wherein the amount of the glycol ether is about 50% to about 70% by weight of the composition, and the amount of the one or more quaternary ammonium hydroxides is about 0.5% to about 15% by weight of the composition.

18. The method of claim 12 wherein the amount of the glycol ether is about 50% to about 70% by weight of the composition, and the amount of the one or more quaternary ammonium hydroxides is about 0.5% to about 15% by weight of the composition.

19. The method of claim 18 wherein the one or more quaternary ammonium hydroxides is tetramethyl ammonium hydroxide.

* * * * *